United States Patent [19]

Thompson

[11] Patent Number: 4,924,234

[45] Date of Patent: May 8, 1990

[54] PLURAL LEVEL BEAM-FORMING NETWORK

[75] Inventor: James D. Thompson, Manhattan Beach, Calif.

[73] Assignee: Hughes Aircraft Company, Los Angeles, Calif.

[21] Appl. No.: 34,460

[22] Filed: Mar. 26, 1987

[51] Int. Cl.⁵ ................................................ G01S 5/02
[52] U.S. Cl. ....................................... 342/369; 342/375
[58] Field of Search ............... 342/368, 369, 373, 375, 342/374

[56] References Cited

U.S. PATENT DOCUMENTS

| | | | |
|---|---|---|---|
| 3,518,689 | 6/1970 | Algeo et al. | 342/375 |
| 3,623,111 | 11/1971 | Provencher | 342/368 |
| 3,646,559 | 2/1972 | Wiley | 342/375 |
| 3,824,500 | 7/1974 | Rothenberg . | |
| 4,041,501 | 8/1977 | Frazita et al. . | |
| 4,101,902 | 7/1978 | Trigon . | |
| 4,176,359 | 11/1979 | Fassett et al. | 342/368 |
| 4,257,050 | 3/1981 | Ploussios . | |
| 4,321,605 | 3/1982 | Lopez | 342/368 |
| 4,348,679 | 9/1982 | Shnitkin et al. | 342/368 |
| 4,532,519 | 6/1985 | Rudish et al. | 342/368 |
| 4,673,942 | 6/1987 | Yokoyama | 342/368 |

FOREIGN PATENT DOCUMENTS 2068644 1/1981 United Kingdom .

Primary Examiner—Thomas H. Tarcza
Assistant Examiner—David Cain
Attorney, Agent, or Firm—Steven M. Mitchell; Wanda Denson-Low

[57] ABSTRACT

A beam-forming network (98) employs one or a plurality of first transmission delay lines (168, 170, 172, 174) for receiving transmit signals (T1-T4) applied thereto, and a plurality of second transmission lines (176), which serve as line summers. Each of the first transmission delay lines has first and second portions (168a, 168b; 170a, 170b; 172a, 172b; 174a, 174b) spaced apart from one another so as to define first and second levels displaced from one another. The set of second transmission lines (176) are arranged in first and second subsets (176a, 176b) which are respectively disposed adjacent to the first and second levels and respectively associated with the first and second portions of the first lines, such that the first subset of second lines is coupled to the first portion of the first lines, and the second subset of the second lines is coupled to the second portion of the first lines. Further, selected ones of the first subset of second lines are disposed adjacent to selected ones of the second subset of second lines in order to facilitate simple and orderly routing of transmission lines (126, 128, 130) between the beam-forming network and a novel equal power amplifier system (100) described herein.

11 Claims, 12 Drawing Sheets

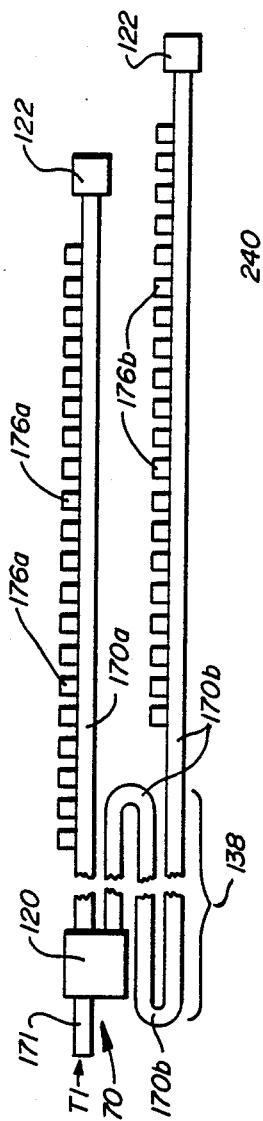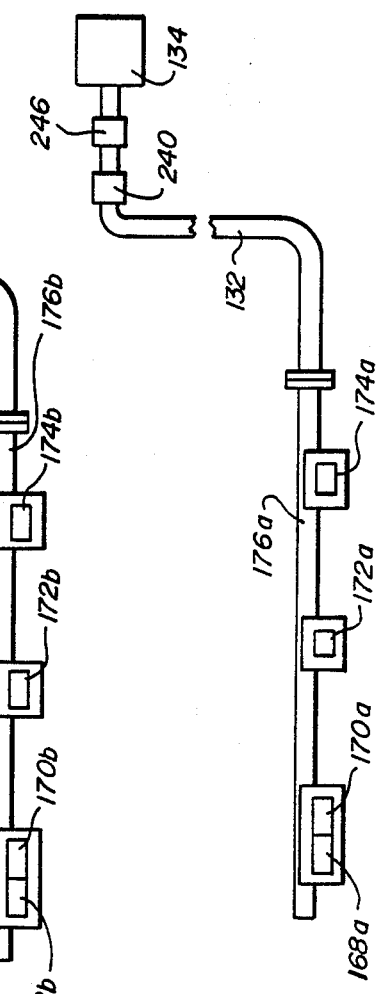
FIG. 9  FIG. 10  FIG. 11

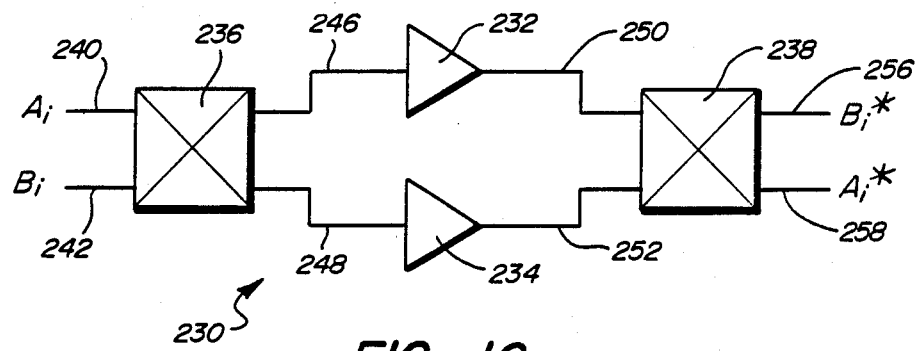
FIG. 16
FIG. 17
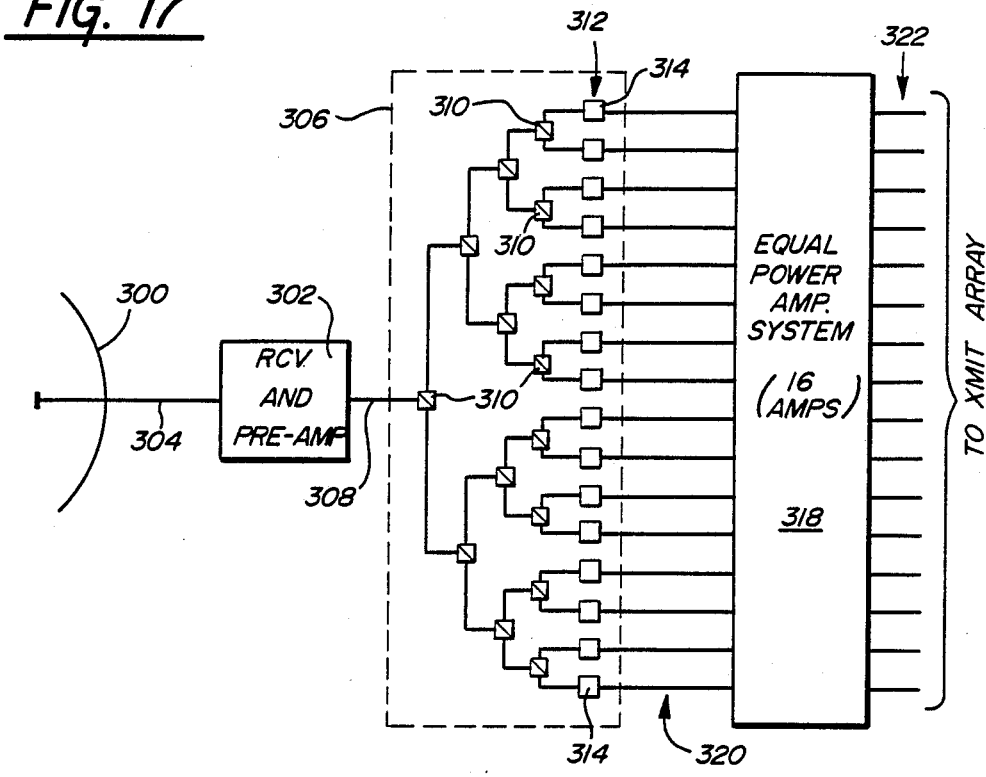

PLURAL LEVEL BEAM-FORMING NETWORK

TECHNICAL FIELD

This invention broadly relates to devices for generating radio frequency transmission beams, especially in the microwave frequencies, and more specifically relates to beam-forming networks for forming a plurality of signals for transmission by an active phase array antenna. The invention in particular is directed to beam-forming networks constructed with a plurality of levels or layers for improved signal line routing and packaging in the transmit antenna system of a communications satellite.

BACKGROUND

In connection with microwave communication systems, such as those used in communications satellites, networks are provided for generating antenna beam signals which are used to drive transmit arrays which in turn form transmit beams to transmit communication signals to an intended destination. Early types of beam-forming networks were used in frequency scanning radar to form a frequency scanning beam. This early type of beam-forming network comprised a single periodic delay line in the form of a meandering transmission line and only a single beam was formed at the time. A relatively large scan angle was covered by the beam in a series of small angular steps, each step corresponding to a frequency step in the radar transmitter. Such a system is a time sequential arrangement.

In other applications, resonant circuit delay networks were employed to achieve frequency addressability to antenna beams. Resonant circuits were employed because the frequencies and bandwidths involved were relatively low and transmission lines having the required delays would have been too long to be practical.

The above-discussed beam-forming networks are unsuitable for high frequency communication satellites wherein it is desirable to simultaneously form a plurality of steerable antenna beams to provide downlink communication channels between the satellite and very small earth terminals. An example of such a communications satellite is disclosed in commonly assigned, co-pending U.S. patent application Ser. No. 896,982 filed Aug. 14, 1986 in the name of H. A. Rosen and entitled SATELLITE COMMUNICATIONS SYSTEM HAVING FREQUENCY ADDRESSABLE HIGH GAIN DOWNLINK BEAMS, which application is hereby incorporated by reference. In the system disclosed in that application, a communications satellite interconnects large numbers of very small aperture earth terminals in a manner which maximizes satellite EIRP as well as the available bandwidth. The system employs highly directional, contiguous beams on the downlink which substantially increases the EIRP and allows multiple reuse of the assigned frequency spectrum. As a result, the number of communication channels that can be provided for point-to-point service is maximized. The high multi-carrier transmitter efficiency is achieved as a result of the dispersion of intermodulation products, and the deleterious effects of rain on the downlink channels are easily overcome by the use of pooled transmitter power. The interconnection of the many users is achieved by a combination of filter interconnection matrix and a highly directional addressable downlink beam.

The beam-forming network used in the communications satellite described in the aforementioned application overcomes each of the deficiencies of the prior art beam-forming networks. This network is described and claimed in commonly assigned, copending U.S. patent application Ser. No 896,911 filed Aug. 14, 1986 in the name of H. A. Rosen and entitled BEAM-FORMING NETWORK, which application is hereby incorporated by reference.

In brief, this beam-forming network is capable of simultaneously forming a plurality of antenna beam signals for transmission by an antenna to a plurality of zones using a plurality of transmit signals respectively corresponding to the zones, wherein each of the transmit signals includes a plurality of subsignals each destined to be received at an associated location in the corresponding zone. The network includes a first plurality of lines for respectively carrying the plurality of transmit signals and a second plurality of spaced apart lines intersecting the first plurality of lines at crossover points of the two sets of lines. The first and second plurality of lines are coupled with each other at the crossover points by cross guide couplers such that a portion of the energy of each of the transmit signals carried by each of the first plurality of lines is transferred to each of the second plurality of lines whereby the output of each of the second plurality of lines is an antenna beam signal which includes all of the subsignals destined to be received at the associated locations in the corresponding zone. The distance between adjacent crossover points and the width of each of the first plurality of lines are pre-selected to produce a desired shift in the phase of each of the subsignals such that the subsignal are steered to the respectively associated locations in the corresponding zones. Accordingly, the beam-forming network is highly suitable for use in a communications satellite which transmits downlink beams to different locations in various zones, wherein the beams are transmitted to each of the zones over the same range of frequencies to effectively provide reuse of the same range of frequencies in all the zones.

One important advantage of the beam-forming network just described is that it produces time delays in the antenna beam signals without the need for resonant circuits or the like. Another advantage is that the network is especially simple in construction and is easy to manufacture. The network described in the two aforementioned U.S. patent applications is constructed on a single level or plane. Such an arrangement is highly satisfactory when the network is used to drive traditional solid-state power amplifier systems associated with active phased antenna arrays.

Antenna beams formed by an active phase array often require unequal excitation coefficients for the array elements. This is done to achieve either a prescribed side lobe level or to form a prescribed beam shape. Frequency addressable antenna beams transmitted by an active phase antenna array, are required for reasonably efficient operation to have in the scanning direction a narrow beam width, maximum gain, and low side lobe levels. To achieve low side lobe levels, the amplitude distribution of the signal set applied to the transmit array may ideally resemble a Taylor distribution, which is a symmetrical and tapered distribution of the type described in T. Taylor "Design of Line-Source Antennas for Narrow Beamwidth and Low Side Lobes", *IRE Trans.-Antennas & Propagation,* pp. 16–28 (January 1955).

To achieve such amplitude tapering with a plurality of power amplifiers operated at or very near saturation, and thus at maximum efficiency so as to conserve power, which is typically the most precious resource to a satellite, I conceived and developed a new amplifier system. My new equal power amplifier system is described and claimed in commonly assigned U.S. patent application Ser. No. 032126 (Attorney Docket No. PD-86284) filed concurrently herewith and entitled EQUAL POWER AMPLIFIER SYSTEM FOR ANTENNA ARRAY AND METHOD OF ARRANGING SAME. My new amplifier system requires an unusual routing of signal lines to the various amplifiers used in the system, which is rather complex to implement when using the beam-forming network described in aforementioned U.S. patent application Ser. No. 896,911.

A principal object of the present invention is reducing the complexity of the signal routing and simplifying the connection of a beam-forming network to the equal power amplifier system described in the just-cited patent application. Another important object of the present invention is to conserve space on the communications shelf of the satellite wherein beam-forming networks are used. Still another object of the present invention is to provide a beam-forming network which, in addition to providing a plurality of antenna beam signals for transmission by an active array antenna to a plurality of zones using a plurality of transmit signals, also provides the amplitude tapering required to produce a predetermined amplitude distribution, such as a Taylor distribution.

SUMMARY OF THE INVENTION

In light of the foregoing objects, there is provided in accordance with the present invention, a beam-forming network for producing, from at least one transmit signal, a plurality of output signals having a predetermined relationship with respect to one another for providing a predetermined excitation pattern to an array of radiating elements in an array antenna. The beam-forming network comprises: a first line for carrying the transmit signal; a set of second lines spaced from one another and operatively disposed at an angle to and crossing the first line so as to define cross-over points therewith, each of the second lines being coupled to the first line at the cross-over points such that a portion of the electromagnetic energy of the transmit signal carried by the first line is transferable to each of the second lines, each of the second lines having an output adapted to be placed in electromagnetic communication with the array. The first line has first and second portions spaced apart from one another which respectively define first and second levels displaced from one another. The set of second lines has first and second subsets of second lines respectively arranged adjacent to the first and second levels, and respectively associated with the first and second portions of the first line, such that the first subset of the second lines is coupled to the first portion of the first line, and the second subset of second lines is coupled to the second portion of the first line.

In the beam-network of the present invention, selected ones of the first subset of second lines are preferably disposed adjacent to selected ones of the second subset of second lines. The transmit signal may be provided simultaneously if desired to the first and second portions of the first line by coupling one end of the first and second portions of the first line together at a common signal splitting device. In this network configuration, the second portion of the first line has a section thereof having a predetermined length for providing a time delay for the transmit signal passing therethrough substantially equal to the length of the delay experienced by the transmit signal as it passes through the first portion of the first line.

The beam forming network of the present invention may be used to produce an excitation pattern from more than one transmit signal, simply by providing additional first lines having the attributes of the first line described above, with each such first line being connected to the second lines at a different set of cross-over points. The excitation pattern produced by the beam-forming networks of the present invention may, after suitable power amplification, be applied to an active phase array antenna to produce a steerable beam or one or more spot beams. My beam-forming network is also compact and conserves space, which can be an important consideration in satellite and other applications. Also, by being on plural levels, and having selected ones of the first subset of second lines disposed adjacent to selected ones of the second subset of second lines, the beam-forming network facilitates simple and orderly routing of the signal lines between the beam-forming network and my novel equal power amplifier system, as will be described herein.

These and other aspects, objects, features and advantages of the present invention will be more fully understood from the following detailed description taken in conjunction with the drawings and appended claims.

BRIEF DESCRIPTION OF THE DRAWINGS

FIG. 9 is a cross-sectional side view of the beam-forming network taken along the line 9—9 of FIG. 8.

FIG. 10 is a cross-sectional side view of the beam-forming network taken along line 10—10 of FIG. 8.

FIG. 11 is a cross-sectional side view of the beam-forming network taken along line 11—11 of FIG. 8.

FIG. 16 is a schematic diagram of a single equal power amplifier apparatus.

FIG. 17 is a simplified block diagram of one embodiment of the communication electronics for a satellite which may be used to transmit a spot beam using an equal power amplifier system.

DESCRIPTION OF THE PREFERRED EMBODIMENTS

The following description of the present invention is presented, in conjunction with the technical discussion set forth above, to enable any person skilled in the art to make and use the present invention, and is provided in the context of a transmit antenna system for a geosynchronous communications satellite and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
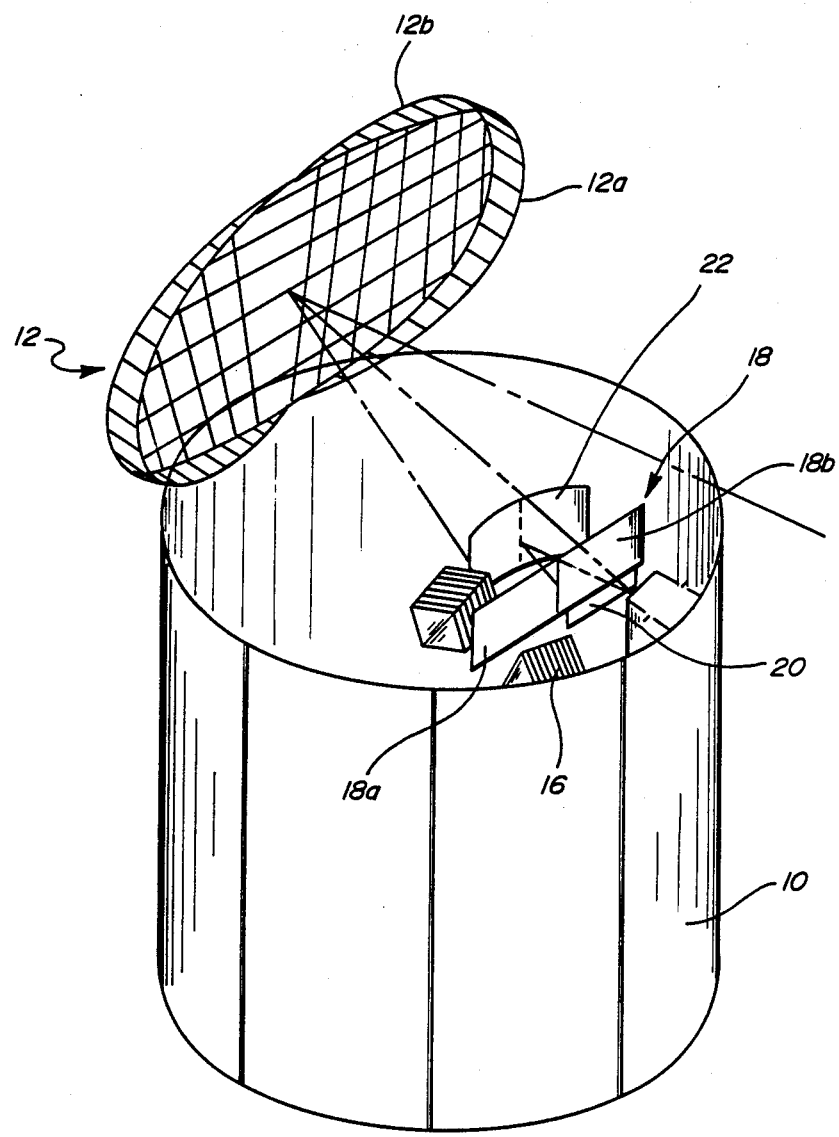
FIG. 1 is a perspective view of a communications satellite employing frequency reuse in which my novel equal power amplifier apparatus and system may be advantageously used.
Figure 2:
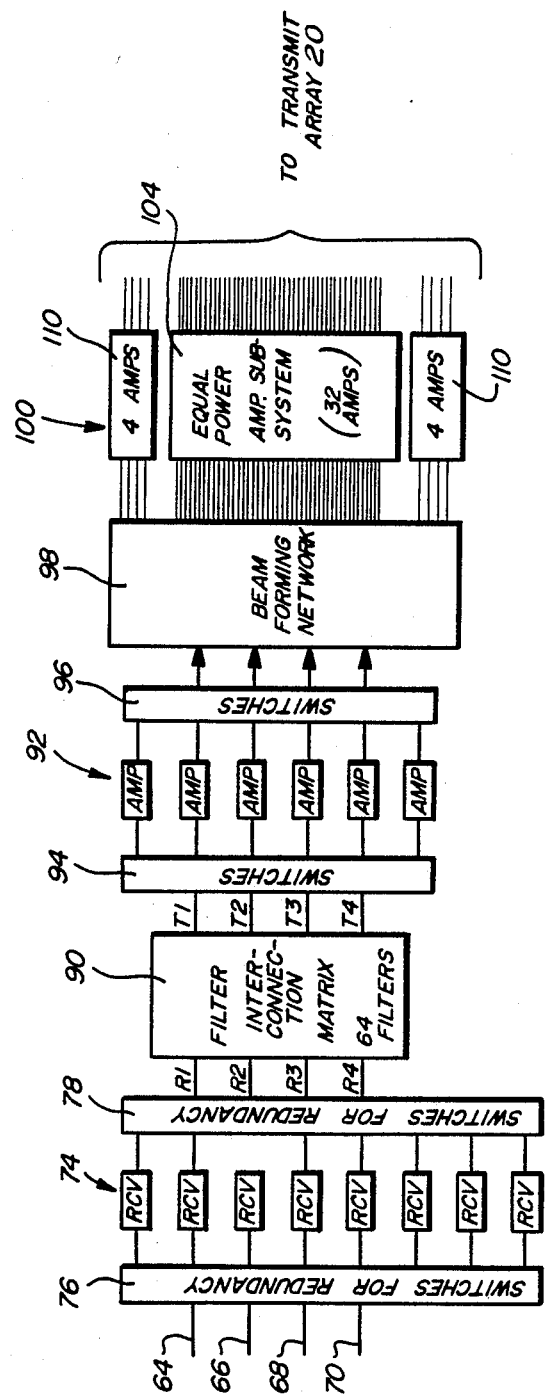
FIG. 2 is a block diagram of one embodiment of the communication electronics for the satellite shown in FIG. 1.

Referring now to FIGS. 1 and 2, the present invention broadly relates to a novel beam-forming network for forming an excitation pattern for driving an array of radiating elements of an antenna system which may be used for example in a communications satellite 10 which may if desired employ frequency reuse. The novel beam-forming network is particularly suited for use with my novel arrangement of power amplifiers for amplifying the excitation pattern which employs a novel equal power amplifier system. One suitable satellite system is a spin-stabilized communications satellite employing frequency reuse, described and claimed in the aforementioned U.S. patent application Ser. No. 896,982. It is to be understood however, that this satellite system, which is placed in geosynchronous orbit above the earth, is merely illustrative of one of the many applications of the beam forming network of the present invention.

The satellite 10 provides point-to-point two-way narrow band voice and data communication in a particular frequency band, for example the fixed satellite service Ku band, between very small aperture antenna terminals. Through the use of frequency division multiple access (FDMA) and reuse of the assigned frequency spectrum, tens of thousands of such communication channels are accommodated simultaneously on a single linear polarization. The antenna system includes a large reflector assembly 12 comprising two parabolic oppositely polarized reflectors 12a, 12b. The two reflectors 12a, 12b are rotated relative to each other about a common axis and intersect at their midpoints. The point-to-point system includes a transmit array 20, a parabolic subreflector 22 and an array of receive feed horns 16. The receive feed horns 16 are positioned in the focal plane of the reflector 12a. The subreflector 22 is mounted forward of the transmit array 20 and slightly below a frequency select screen 18. The frequency select screen 18 includes two oppositely polarized half portions 18a, 18b which function as diplexers to separate different bands of frequencies. Thus they effectively separate the transmit and receive signals, which may be assigned to 500 MHz frequency bands 11.7–12.2 GHz and 14.0–14.5 GHz, respectively. The signal emanating from the transmit array 20 is reflected by the subreflector 22 onto portion 18b of the screen 18. The signal, in turn is reflected by portion 18b of the screen 18 onto a large reflector 12b which in turn reflects the point-to-point signal to earth. The subreflector 22, when used in conjunction with the main reflector 12, functions to effectively magnify and enlarge the beam pattern emanating from the transmit array 20. Through this arrangement, the performance of a large aperture phase array is achieved.

Figure 3:
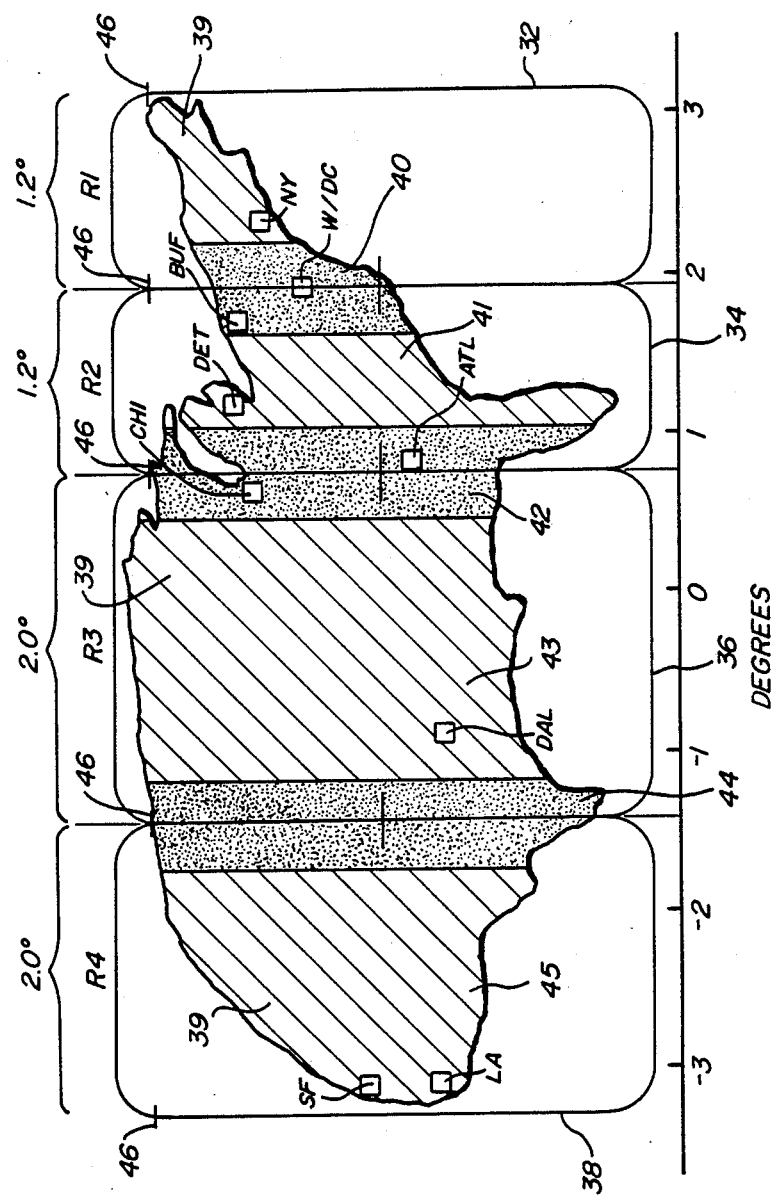
FIG. 3 is a view of the United States and depicts multiple contiguous receive zones covered by the FIG. 1 satellite, the primary areas of coverage being indicated in cross-hatching.

FIG. 3 depicts a generally rectangular beam coverage provided by the point-to-point receive system. In this particular example, the area serviced is the continental United States. The point-to-point receive system comprises four receive beams R1, R2, R3, R4 respectively emanating from the four receive zones 32, 34, 36, 38 to the satellite. The signal strength for each of the four beam pattern contours 32, 34, 36, 38 are approximately 3 dB from peaks of their respective beams. The antenna beams are designed to achieve sufficient isolation between them to make feasible reuse of the frequency spectrum four times, with one use of the frequency spectrum in each of the cross-hatched regions 39, 41, 43, 45.

Figure 4:
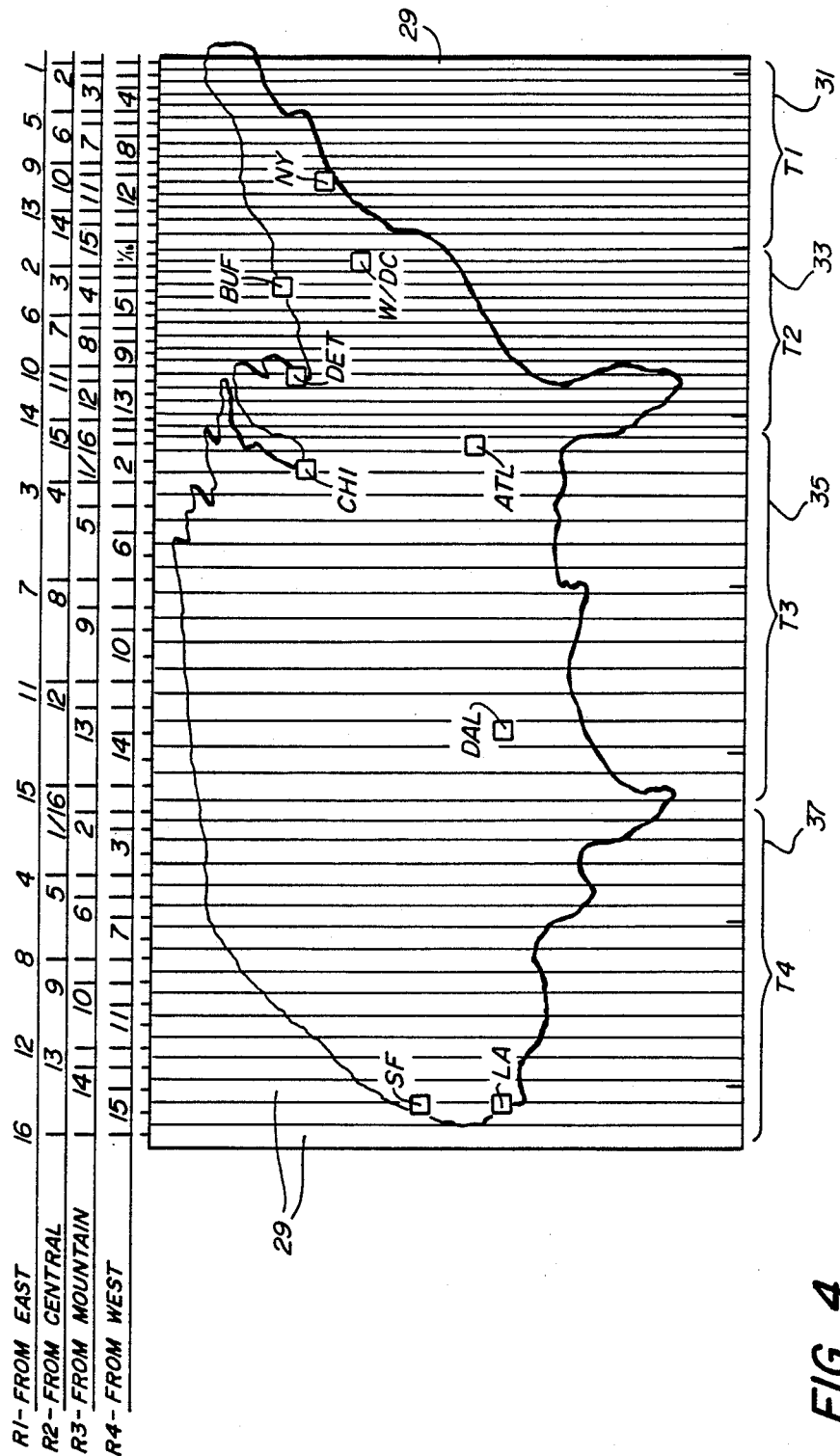
FIG. 4 is a diagrammatic view of the United States depicting multiple contiguous transmit zones of the FIG. 1 satellite.

Referring to FIG. 4, the transmit beams T1, T2, T3, T4 respectively cover four contiguous transmit zones 31, 33, 35, 37 which collectively cover the area to be serviced, namely the continental United States. Each of the beams T1–T4 consists of a plurality of individual downlink beams destined for individual downlink sites in each of the zones 31, 33, 35, 37. The widths of the transmit zones 31, 33, 35, 37 are nearly the same as those of the receive zones R1, R2, R3, R4.

Each of the receive beams R1–R4 and the transmit beams T1–T3 may respectively utilize the entire 500 MHz uplink frequency band between 14.0 and 14.5 GHz and the entire 500 MHz downlink frequency band between 11.7 and 12.2 GHz. This total frequency spectrum (500 MHz) is divided into a plurality of channels, for example, 16 channels each having a usable bandwidth of 27 MHz and the spacing of 30 MHz. In turn, each of the 16 channels may accommodate approximately 800 subchannels. Hence, within each zone, approximately 12,500 (16 channels × 800 subchannels) 32 kilobit per second channels may be accommodated, at any given moment. The communication architecture of the system allows any ground terminal to communicate directly with any other ground terminal. Thus, within a single polarization, a total of 50,000 subchannels may be accommodated nationwide.

Figure 5:
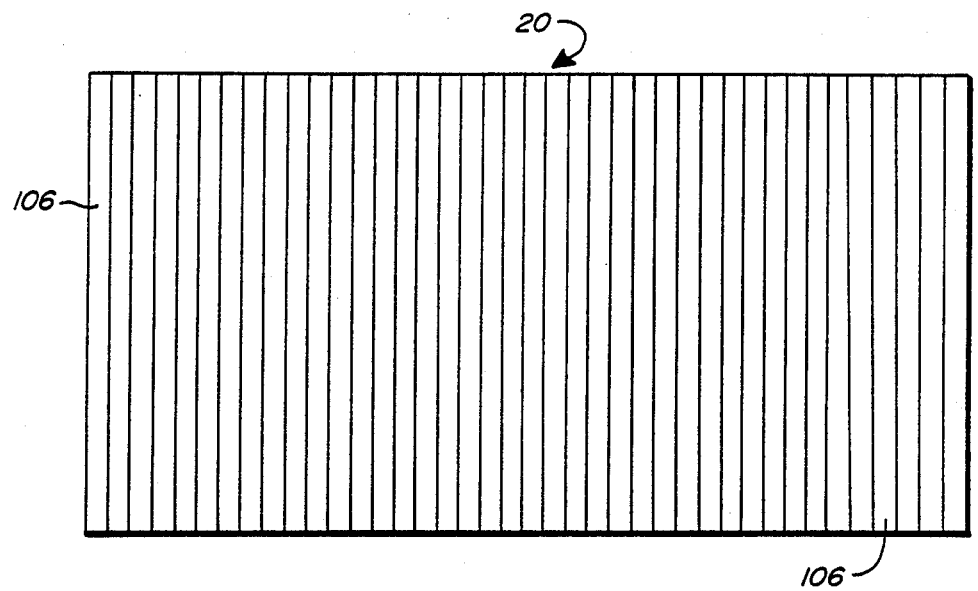
FIG. 5 is a simplified front elevational view of an active phase transmit array.

Referring to FIGS. 1 and 5, the individual downlink beams are generated by a transmit array 20 whose apparent size is magnified by two confocal parabolic reflectors 22 and 12b. The transmit array 20 comprises of a plurality, for example forty, transmit waveguide elements 106 disposed in side-by-side relationship. The elements 106, which are sometimes called staves, are driven by transmit amplifier system 100 shown in FIG. 2, which will be later discussed in detail. The amount of power delivered to each of the elements 106 of array 20 is not uniform but is instead tapered with the outer edge elements being more than 10 dB down. The tapering of the individual downlink beams is achieved by adjusting the strength of the transmit signals according to the relative position of the elements 106 within the array 20.

Figure 7:
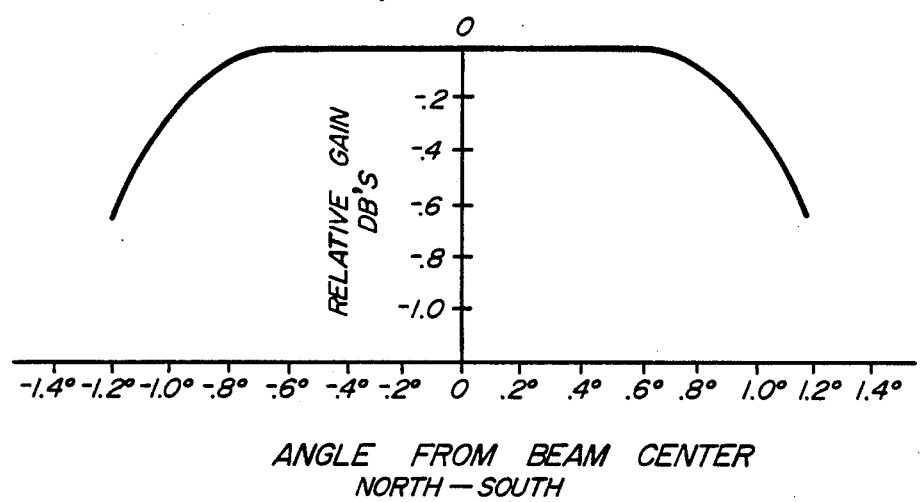
FIG. 7 is a graph similar to FIG. 6 but showing the variation in gain in the north-south direction.
Figure 6:
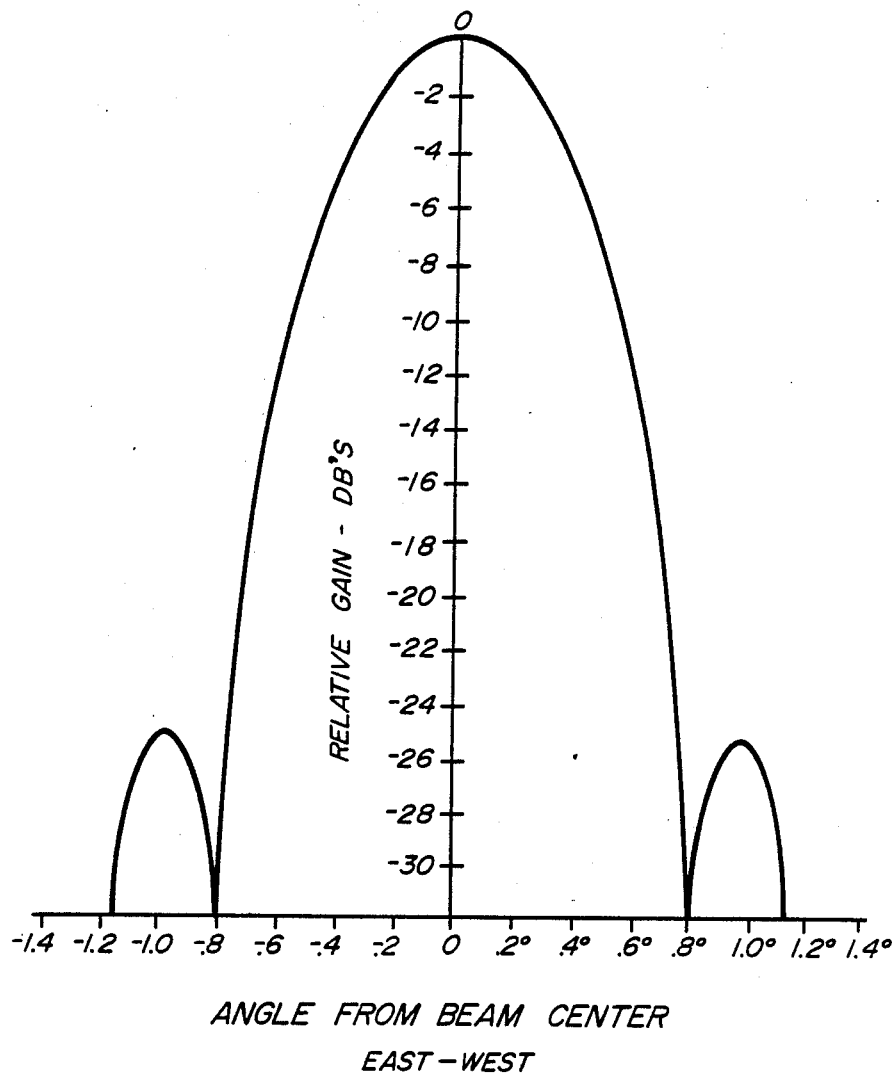
FIG. 6 is a graph showing the variation in gain of the transmit antenna beam for each zone serviced by the satellite in relation to the distance from the center of the beam in the east-west direction.

Referring to FIGS. 6 and 7, the excitation pattern of the array 20 determines the characteristics of the transmit secondary pattern. Specifically, the east-west direction of each downlink beam is determined by the phase progression of its signal along the array 20 of transmit elements 106. This phase progression is established by a later discussed beam-forming network 98 shown in block form in FIG. 2. The progression is a function of frequency. In addition, the individual transmit gains of the transmit beams have been adjusted to provide low side lobe levels, thereby permitting frequency reuse in adjacent transmit zones 31, 33, 35, 37 (see FIG. 4). The side lobe levels at angles off beam center is more than 30 dB down, so that interference between zones is negligibly small.

FIG. 7 is an illustration of the transmit beam pattern in the north-south direction. The transmit array elements 106 are excited in the manner which creates a nearly flat north-south pattern extending over the covered range of 1.4° on either side of the north-south bore sight direction.

FIG. 2 depicts the signal flow and electronics for receiving and transmitting signals for the point-to-point system. The point-to-point receive signals 64-70 are the receive signals, one from each of the four receive zones 32, 34, 36, 38 serviced by the satellite 10. The signals 64-70 are input to a switching network 76 which selectively connects input lines 64 through 70 with four corresponding receivers, seven of which receivers are generally indicated at 74. The receivers 74 are of conventional design, and three of the receivers 74 are provided for redundancy. Receivers 74 function to drive the filters in a filter interconnection matrix 90. The outputs of the receivers 74 connected with lines 64 through 70 and are coupled by a second switching network 78 through four receive lines R1-R4, to a filter interconnection matrix 90. The matrix 90 provides interconnection means between the receive zones 32, 34, 36, 37 and transmit zones 31, 33, 35, 37 covered by the satellite 10. The filter outputs T1-T4 are each destined for one of the four transmit zones 31, 33, 35, 37 service by the satellite 10.

The transmit signals T1-T4 are respectively connected by a switching network 94 to four of six driving amplifiers 92, two of such amplifiers 92 being provided for backup in the event of failure. A similar switching network 96 couples the amplified output of the amplifiers 92 to a beam-forming network 98.

Further information about the foregoing aspects of the communication satellite 10, such as the construction of array 20 and the filter interconnection matrix 90, are disclosed in full detail in the aforementioned U.S. patent applications Ser. Nos. 896,911 and 896,982, and thus will not be described further herein, except where necessary for an understanding of the equal power amplifier system and method of the present invention, which will now be described.

The beam-forming network 98 is composed of four delay lines for carrying the transmit signals T1-T4, and a larger number of transmission delay lines arranged orthogonally to and connected at equal intervals along the transmit signal delay lines. These intervals and the width of the delay lines are chosen to provide the desired center band beam squint and the beam scan rate with frequency for the corresponding transmit zones 31, 33, 35, 37 to be serviced. The transmit signals, coupled from the four delay lines, are summed in the beam-forming network as will be explained with respect to FIGS. 8-12, to provide inputs to the transmit equal power amplifier system 100. In the illustrated embodiment discussed below, 40 solid state power amplifiers (SSPAs) are provided to perform this amplification function. As indicated in FIG. 2, 32 of the 40 SSPAs are associated with the central equal power amplifier system 104, and cooperate to amplify 32 of the 40 signals formed by the beam-forming network 98. The other eight signals are low amplitude signals and are individually amplified by distinct SSPAs arranged in two side amplifier groups 110 of four SSPAs each. The eight amplifiers may be each equal in power rating, but considerably smaller in power rating than the other 32 SSPAs. The 40 outputs of the central system 104 and the side groups 110 are connected to the individual radiating elements of the transmit array 20.

Figure 8:
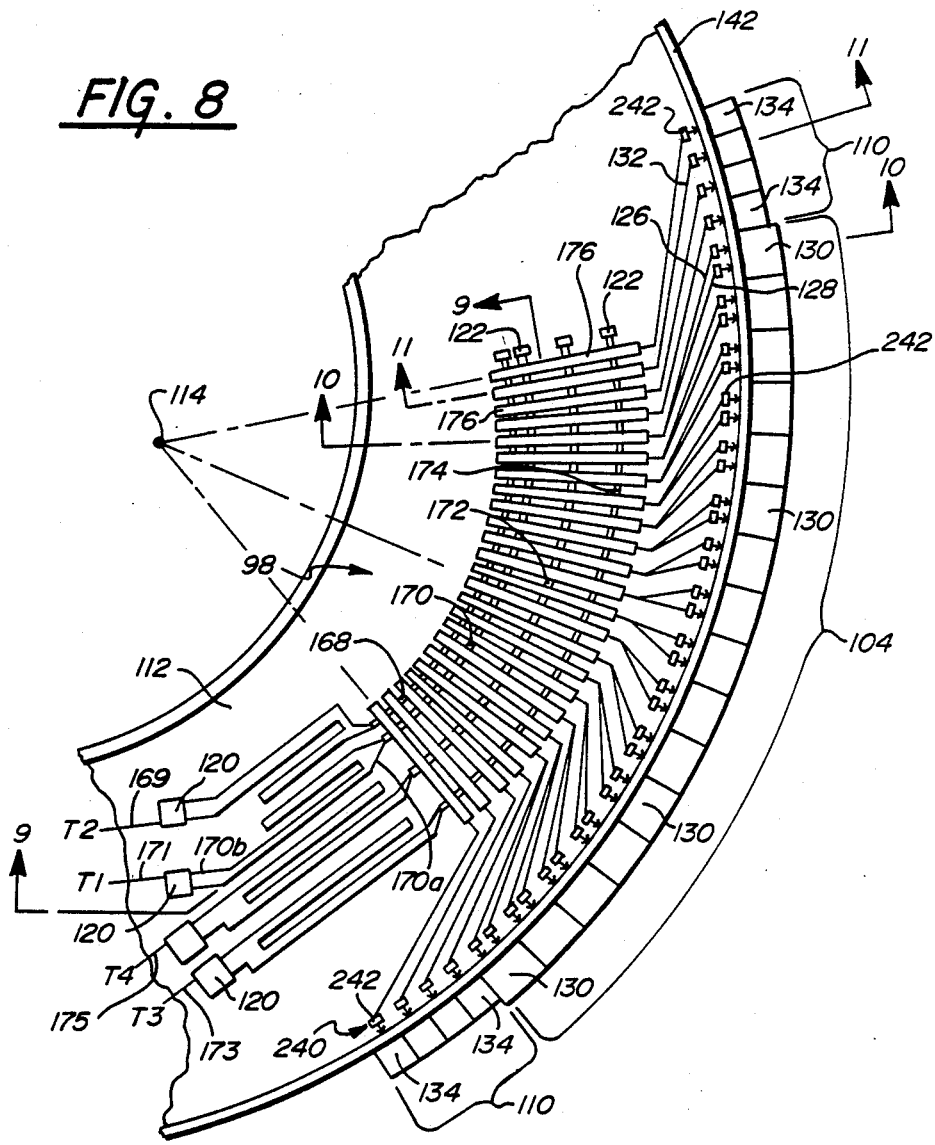
FIG. 8 is a plan view of a preferred beam-forming network of the present invention shown in conjunction with my new equal power amplifying apparatus.

As shown in FIG. 8, the beam-forming network (BFN) 98 is preferably arranged in the general form of an arc and may be conveniently mounted on a despun generally annular communication shelf 112 (partially shown) of the satellite 10. The arc-shaped pattern for the BFN facilitates an arrangement which assures that the transmission delay lines for signals passing therethrough are of correct length and properly coupled to signal summers, which preferably take the form of radially extending waveguide assemblies, as will be explained. In the aforementioned U.S. patent applications Ser. Nos. 896,911 and 896,982, a similar BFN is shown which has all 40 of its radially extending waveguide assemblies spaced equally apart in angle and arranged on a single level or plane. Such a single level BFN may also be used with my equal power amplifier system, if desired. However, to substantially improve signal line routing and packaging between the BFN and the central equal power amplifier system 104, the BFN 98 of the present invention has its radial line summers arranged on two levels or planes, as best illustrated in FIGS. 9 through 11.

As shown in FIG. 8, the beam-forming network 98 includes four circumferentially extending transmission delay lines 168, 170, 172, 174 which respectively carry transmit signals T1-T4, and a plurality of radially extending waveguide assemblies 176. In the presently preferred configuration, there are forty waveguide assemblies 176, one for each of the radiating elements 106 of the transmit array 20. The waveguide assemblies 176 intersect each of the delay lines 168-174 and are equally spaced in angle relative of the concentric arcs defined by the major portions of the transmission delay lines 168-174, which arcs have a common center point or axis at location 114. Transmit signal T1 is provided to the input 171 of delay line 170, signal T2 is provided to the input 169 of delay line 168, signal T3 is provided to the input 175 of delay line 174, and signal T4 is provided to the input 173 of delay line 172.

Figure 12:
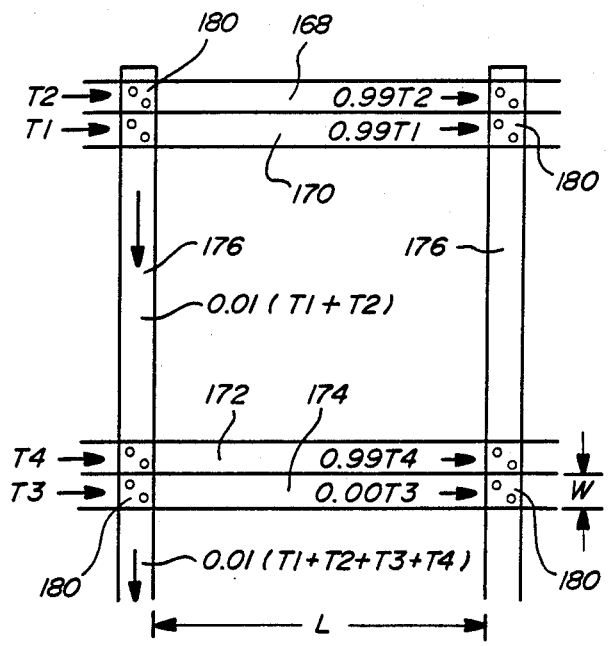
FIG. 12 is a diagrammatic plan view of selected portions of the beam-forming network illustrating signal flow therethrough.

Each of the waveguide assemblies 176 defines a radial line summer, and is coupled to each of the delay lines 168-174 in order to be able to perform this summing function. As shown in FIG. 12, at the point of intersection between each waveguide assembly 176 and delay line 168-174, a crossguide coupler 180 provides a desired electromagnetic signal path between the delay lines 168-174 and the radial line summers 176.

As shown in FIG. 12, the distance between the radial line summers is indicated by the letter "L" and the width of each of the radial delay lines is designated by the letter "W". Although the radial line summers 176 are spaced at equiangular intervals along the delay lines 168-174, the distance between them varies from delay line to delay line due to the fact that the delay lines 168-174 are radially spaced and therefore diverge from each other. Thus, further from the center 114 of the concentric arc of delay lines 168-174, the distance is greater between adjacent radial line summers 176, making the spacing "L" between adjacent lines 176 for delay line 174 more than the spacing "L" between lines 176 for delay line 168. Typical values (in inches) for the dimensions "L" and "W" are as follows:

| Delay Line | Signal | L | W |
|---|---|---|---|
| 168 | T2 | 1.66 | 0.64 |
| 170 | T1 | 1.72 | 0.66 |
| 172 | T4 | 2.45 | 0.74 |
| 174 | T3 | 2.55 | 0.76 |

The various widths "W" and distances "L" associated with the delay lines 168-174 are chosen to provide the desired center beam squint and beam scan rate so that the beam pointing is correct for each channel. This results in the desired start and stop points for each of the transmit zones T1-T4.

Referring particularly to FIG. 12, the transmit signal T2 propagates down the delay line 168 for a precise distance, at which point it reaches the first radial line summer 176. A portion of the T2 signal passes through the crossguide coupler 180, which may, for example, be a 20 dB coupler, such that one percent of the transmitted power of transmit signal T2 is diverted down the radial line summer 176. This diverted energy then propagates down the waveguide 176 towards equal power amplifier system 100 (FIGS. 2 and 8). This process is repeated for signal T1 which propagates down delay line 170. The portions of signals T1 and T2 which are diverted by the crossguide couplers 180 (e.g. 0.01 T1 and 0.01 T2) are summed together in the radial line summer 176 and the combined signal 0.01 (T1+T2) propagates radially outwardly toward the next set of delay lines 172, 174. This same coupling process is repeated for signals T3 and T4 in delay lines 174 and 172 respectively. That is, 0.01 of signals T3 and T4 are coupled via crossguide couplers 180 to the radial line summer 176. The resulting combined signal 0.01 (T1+T2+T3+T4) propagates radially outwardly to an associated individual solid state power amplifier in one of the groups 110 or to the equal power amplifier subsystem 104, where it is amplified in preparation for transmission.

After encountering the first radial line summer 176, the remaining 0.99 of signals T1-T4 propagate to the second radial line summer where an additional percentage of the signals such as one percent (or some other preselected value) is diverted to the summer 176. This process of diverting a selected percentage of the signals T1-T4 is repeated at each of the radial line summers 176.

The signals, propagating through the radial line summers 176 towards the power amplifier system 100, are a mixture of all four point-to-point transmit signals T1-T4. However, each of the transmit signals T1-T4 may comprise 12,500 subsignals. Consequently, the forty signals propagating through the radial line summers 176 may be a mixture of all 50,000 signals in the case of the embodiment mentioned above where the assigned frequency spectrum is 500 MHz wide. Therefore, each of the SSPAs may be said to amplify all 50,000 signals.

Figure 13:
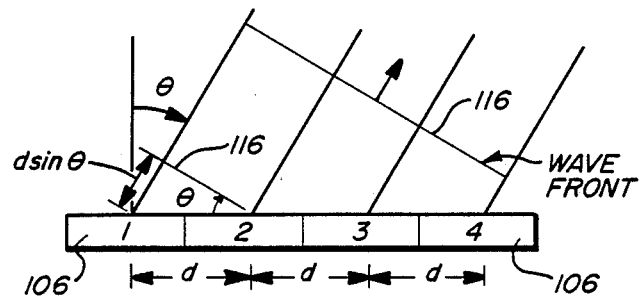
FIG. 13 is an enlarged fragmentary side view of a portion of the active phase array of FIG. 5.

An incremental phase shift is achieved between the signals that are coupled in the forty radial line summers 176. Hence, the beam-forming network 98 permits the antenna beams emanating from the transmit array 20 (FIGS. 1 and 4) to be steered by frequency assignment. The incremental phase shift is related to the time delay due to signal propagation along the arcuate delay lines 168-174 between the waveguides 176 as well as frequency. This may be better understood by reference to FIG. 13 which is a diagrammatic view of four of the forty transmit array elements 106 of FIG. 5, showing wavefronts 116 emanating therefrom, wherein "d" is the spacing between transmit array elements 106. The resulting antenna beam has an angular tilt of $\theta$, where $\theta$ is defined as the beam scan angle, that is the angle of the plane of the wavefronts 116 from the normal 118 of the transmit beam center. The incremental phase shift produced by the delay line arrangement is $\Delta\Phi$. The relationship between the incremental phase shift and the beam scan angle is given by:

$$\Delta\Phi = \frac{2\pi d}{\lambda} \sin\theta \qquad (1)$$

where $\lambda$ is the signal wavelength of the wavefronts 116, and d is the spacing between array elements 106. Hence, the east-west direction of the antenna beam is determined by the incremental phase shift which is different for the four delay lines 168-174 of the beam-forming network 98, resulting in the four transmit zones T1-T4 previously noted.

The two levels of BFN 98 will now be explained by reference to FIGS. 8 through 11. FIG. 9 is a cross-sectional side view of BFN 98 taken along arcuate line 9—9, which provides a full side view of a typical one of the transmission delay lines, namely line 170 which carries transmit signal T1. Line 170 is split into first and second portions 170a and 170b at a signal splitting device 120, which may be a power divider or suitable directional coupler. The upper and lower lines 170a and 170b are respectively coupled to the upper 20 and lower 20 waveguides 176, as shown. For convenience the 20 waveguides 176 on the first or upper level are identified by reference numeral 176a, while the 20 waveguides on second or lower level are identified by reference numeral 176b. Each of the lines 170a and 170b is terminated at the far end thereof with a suitable nonreflective load 122. The other transmission delay lines 168, 172 and 174 are arranged in the same basic manner as transmission delay line 171 is, including having signal splitters 120 and terminating loads 122.

FIGS. 10 and 11 are cross-sectional views respectively taken radially along line 10—10 and line 11—11 of FIG. 8 respectively showing a typical section of the two level portion and single lower level portion of BFN 98. FIG. 10 shows that each of the transmission delay lines 168, 170, 172 and 174 are split into respective upper and lower portions 168a, 168b, 170a, 170b, 172a, 172b and 174a, 174b. Uper waveguide assembly 176a and lower waveguide assembly 176b are respectively connected to transmission lines 126 and 128 which allow the output signals of the waveguides to be applied to an equal power amplifying apparatus 130. In FIG. 11 a similar transmission line 132 allows the output signal of the waveguide assembly 176a shown therein to be delivered to an SSPA 134 of side amplifier group 110.

The proper time delay associated with the transmit signals as they propagate through the BFN 98 is maintained even though the BFN is arranged in two levels. Referring to FIGS. 8 and 9, the time delays are maintained by splitting the transmit signals T1–T4 in half by using the four hybrid couplers 120, one for each signal, before the signals T1–T4 enter the main portion of the beam-forming network 98, and by providing extra line length in lower line portions. FIG. 9 illustrates the splitting of one such signal, signal T1, by hybrid coupler 120, with one-half of the signal T1 from coupler 120 going to upper line portion 170a and one-half of signal T1 going to lower line portion 170b. The line portion 170b is made longer than line 170a by a predetermined amount in the zig-zag section 138 to introduce a time delay into the signal in line portion 170b equal to the time delay encountered by the signal as it propagates through the upper portion 170a. The extra length added by the zig-zag section 138 should be reduced (or increased) as necessary to compensate for the 90° phase shift lag (or lead) caused by the hybrid coupler 120. By increasing the length of lower portion 170b to take into account the time it takes for signal T1 to travel through the upper layer of the beam-forming network 98, the two layered beam-forming network 98 performs as if it was arranged in one continuous arc on a single level. However, the two-level BFN 98 has the advantage that pairs of signals from selected waveguides 176 to be amplified by the same equal power apparatus 130 are adjacent one another, thus greatly simplifying routing of transmission lines such as lines 126 and 128, and avoiding the need to cross them with other similar transmission lines. This two-level BFN also uses less space on the communications shelf 112.

The transmit signals T1–T4 coupled from the four delay lines 168, 170, 172, 174 are summed together in the beam-forming network 98. These signals emanate from the BFN 98 at the outputs of waveguides 176 and are provided as inputs over suitable lines (such as lines 126, 128 and 132) to the equal power amplifier system 100. As shown in FIG. 8, the amplifier system may be mounted, for example, on the outer rim 142 of communications shelf 112. The 40 signals amplified by system 100 are fed into individual elements 106 of the transmit array 20.

Attention is now directed to FIGS. 2 and 8. The equal power amplifier system 100 shown therein is comprised of 16 equal power amplifying apparatuses 130 and 8 individual solid-state power amplifiers 134. The equal power amplifier apparatuses 130 are coupled to selected pairs of signals emanating from the radial line summers 176 of the BFN 98 so that all of the paired signals have substantially the same average combined power. The signals to be paired are pre-selected according to my pairing process discussed below. Each of the signals in a selected pair are simultaneously amplified by two power amplifiers in the associated equal power amplifying apparatus 130, the preferred construction of which will be discussed shortly. In contrast the signals that are not paired are amplified by individual solid state power amplifiers 134, which may be of various power ratings but are preferably of one standard rating.

Figure 14:
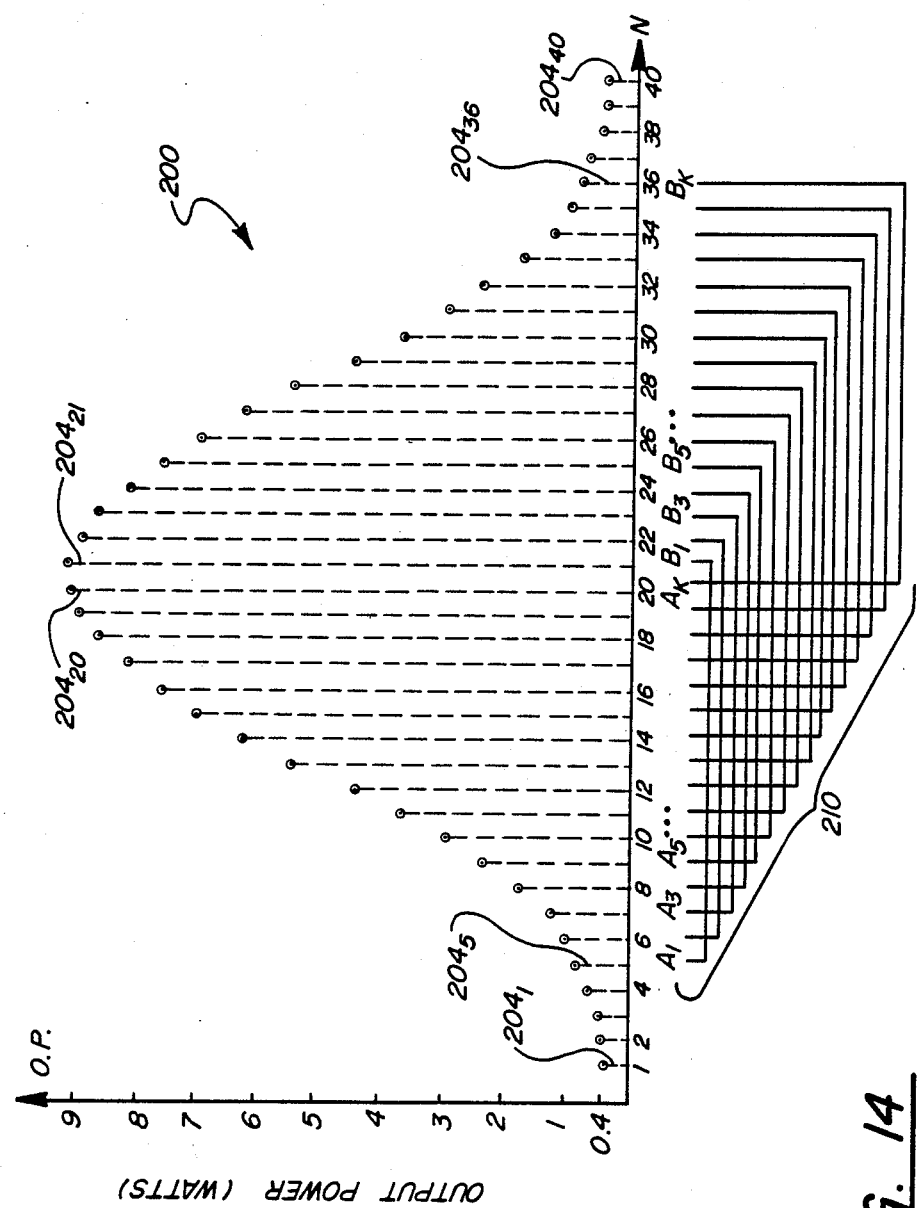
FIG. 14 is a plot showing the distribution of signal amplitudes associated with one excitation pattern which may be applied to specific elements of the FIG. 5 array to obtain a narrow downlink beam-width and low side lobes, with the U-shaped lines therebelow indicating pairs of signals from the excitation pattern, selected in accordance with the method of the present invention, which are amplified in common by the pairs of equal power amplifiers.
Figure 15:
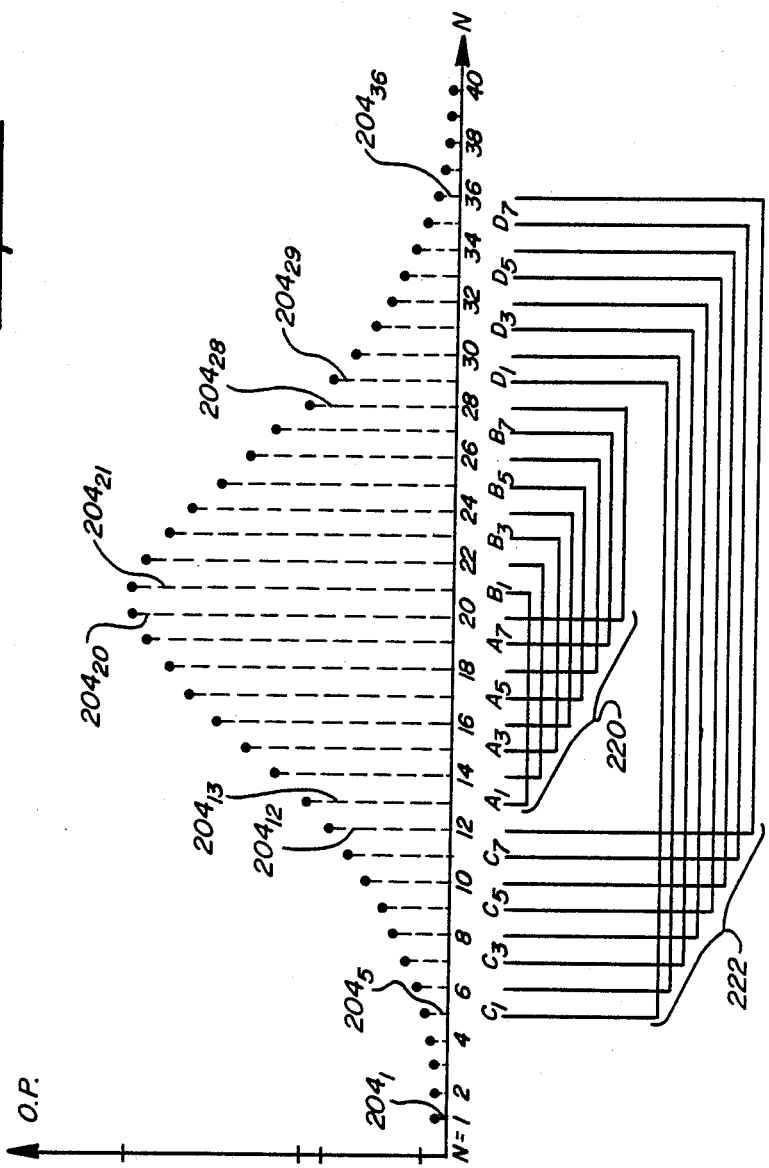
FIG. 15 is a plot similar to that of FIG. 14 but indicating two sets of pairs of signals which are amplified in common by pairs of equal power amplifiers.

Attention is now directed to FIGS. 14 and 15, which respectively illustrate Taylor distributions 200 and 202, that may be each used to produce frequency addressable downlink antenna beams. A Taylor distribution is symmetrical and tapered and it is selected for use because it produces beams of narrow beam width and low side lobe levels, two characteristics essential to frequency addressable beams. Each distribution shown may be said to consist of N distinct signals, with one signal associated with each stave 106 of the transmit array 20, where the array 20 has N number of staves. Shown in the distributions 200 and 202 are the amplitude coefficients $204_1$ through $204_{40}$ which represent the voltage excitation levels to be applied by the corresponding signal to each respective array element 106. By appropriately pairing the signals in each distribution on the basis of the relative size of their amplitude coefficients, the present invention minimizes the number of individually and specially sized amplifiers that need to be designed to produce the desired array distribution.

The set 210 of U-shaped lines in FIG. 14 shows one preferred method of pairing up 32 signals of the 40 signals in amplitude distribution 200. The average value of the paired signals is substantially constant and this value is effectively preselected or dictated by the type of array distribution function and the number of different types or sizes of amplifiers desired to be used in the amplifier system. The amplifiers designated to amplify the paired signals are preferably identical. In a preferred arrangement, thirty-two of the forty elements 30 are paired together as illustrated in FIG. 14. Hence, thirty-two of the forty amplifiers in the amplifier arrangement 40 may be and preferably are identical. The elements that are paired together are $A_1$ and through $A_K$ and $B_1$ through $B_K$, where K is the number of paired elements. For the FIG. 14 example, K=16. The paired amplitude coefficients $204_5$ through $204_{20}$ from the left half of the distribution are designated $A_1$ through $A_K$ from left to center, and the amplitude coefficients $204_{21}$ through $204_{36}$ for the right half of the distribution are designated $B_1$ through $B_K$ from the center to right. As shown in FIG. 14, the lower power signals from the left side of the distribution are coupled with the higher power signals from the right side of the distribution, and vice-versa, such that the average power of all paired signals is constant. For example, $A_1$ is averaged with $B_1$, $A_2$ with $B_2$, and in general $A_i$ with $B_i$ (where i represents any integer from 1 to K) so that $A_1^2 + B_2^2 = A_2^2 + B_2^2 = A_i^2 + B_i^2 = P_0$, where $P_0$ is the average power associated with each signal pair.

FIG. 16 shows a preferred embodiment 230 of the equal power amplifying apparatus 130 of the present invention. Amplifying apparatus 230 is comprised of two solid-state power amplifiers (SSPAs) 232, 234 and two hybrid couplers 236 and 238 connected as shown. Typical signals to be paired $A_i$ and $B_i$ are presented on input lines 240 and 242 respectively for simultaneous amplification by amplifiers 232, 234. The signals $A_i$, $B_i$ on lines 240, 242 are averaged together by signal dividing means, that is the first hybrid couple 236, which routes one-half of the power from each of the incoming signals $A_i$ and $B_i$ to each of the amplifiers 232, 234 such that the signal on line 246 is composed of $\frac{1}{2}A_i + \frac{1}{2}B_i^*$ and signal on line 248 is composed of $\frac{1}{2}A_i^* + \frac{1}{2}B_i$. The asterisk denotes that the half-signals which cross over hybrid coupler 236 are phase-shifted by 90°. The two averaged signals on lines 246, 248 are amplified equally and respectively by the amplifiers 232, 234 preferably because the amplifiers are substantially identical and both are operated at or near maximum efficiency. In order to reconstitute the amplified input signals $A_i$, $B_i$ from the amplified intermediate signals output on lines 250, 252 by amplifiers 232, 234, the amplified intermediate signals are routed through the second hybrid coupler 238. Coupler 238 routes one-half the power from each of the signals on lines 250, 252 to the output lines 256, 258 and again introduces a 90° phase shift into the signals which cross thereover. The amplified output signals on lines 256, 258 are thus reconstituted in a crossed-over fashion as shown, with the amplified output signal $A_i^*$ on line 70 and amplified signal $B_i^*$ on line 68. Again the asterisks serve to indicate these amplified signals on lines 258 and 256 respectively are 90° out of phase with the original input signals $A_i$, $B_i$ presented on input lines 240, 242. The hybrid coupler 238 thus operates as a signal combining means and produces its output signals $A_i^*$ and $B_i^*$ by destructive and constructive interference of components of the two intermediate signals from amplifiers 232, 234.

Thus, those in the art will appreciate that the amplifier system of the present invention has the advantage of effectively using two power amplifiers simultaneously operated in parallel to amplify a strong signal that is applied to a single radiating element. This can be reduced by almost one-half the maximum size of power amplifier which a transmit antenna system requires if the pairs of signals are properly selected.

The signals $204_1$-$204_4$ and $204_{36}$-$204_{40}$ in FIG. 14 could have been included in the pairing if desired by simply allowing K to equal 20 in the foregoing example. If this were done, the equal power amplifier system would only need one size of power amplifiers. However, computer simulation shows that by individually amplifying the four signals on either end of the distribution, the resultant side lobes produced by the array 20 are lowered by several decibels. As shown in FIGS. 8 and 11 these lower level signals can be amplified by individual SSPAs 134. Since the amplitudes of these signals are very low, e.g., approximately one-fifth of $\frac{1}{2}(A_i+B_i)$, each SSPA 134 can be made correspondingly smaller than the pair of power amplifiers used in the equal power amplifying apparatus 130. Since the SSPAs 134 operate at relatively low power, it is practical to build all 8 SSPAs 134 the same size, so as to operate the two SSPAs associated with the signals $204_4$ and $204_{37}$ at peak efficiency, and operate the six others at somewhat less than peak efficiency without wasting much power. Accordingly, the equal power amplifier system 100 described with respect to FIGS. 8–11 and 14 preferably has two distinct sizes of power amplifiers, namely the size required for the equal power amplifying apparatus 104 and the size required for the SSPAs 134.

FIG. 15, illustrates that the equal power concept of the present invention can be extended so that two groups of equal power amplifying apparatuses, with each group its own uniform but having distinctly different size of power amplifiers, can be used to amplify a set of signals having desired amplitude distribution, such as distribution 202. As indicated by the interior set 220 of U-shaped lines, relatively high power signals designated $A_1$-$A_8$ which correspond to signals $204_{13}$ through $204_{20}$, may be paired with complementary signals designated $B_1$-$B_8$ which correspond to signals $204_{21}$ through $204_{28}$. For this first set of pairings, K=8 and $A_1^2+B_1^2=A_2^2+B_2^2=A_i^2+B_i^2=P_1$, where $P_1$ is the average power with the associated with these 16 signals $A_1$ through $B_K$. As indicated by set 222 of U-shaped lines, relatively moderate power signals designated $C_1$-$C_8$ associated with amplitude coefficients $204_5$ through $204_{12}$ may be paired with complementary signals designated $D_1$-$D_8$ associated with amplitude coefficients $204_{29}$ through $204_{36}$. For this second set of pairings, $C_1^2+D_1^2=C_2^2+D_2^2=C_i^2+D_i^2=P_2$, where $P_2$ is the average power associated with the 16 signals $C_1$-$C_8$ and $D_1$-$D_8$. Accordingly, the two amplifiers in each of the equal power amplifying apparatuses serving signals $A_1$-$B_8$ ideally may have of a power rating of $P_1/2$, similarly, each of two power amplifiers in each of the equal power amplifying apparatuses serving signals $C_1$-$C_8$ and $D_1$-$D_8$ ideally may have a distinctly lower power rating of $P_2/2$. With certain types of amplitude distributions, $A_i^2+B_i^2$ may slightly exceed, rather than be equal in value to, $A_j^2+B_j^2$, where i and j are different integers with the permissible range of values in a pair signal set consisting group A signals and group B signals. In such situations, the all of the amplifiers of the equal power amplifying apparatus serving paired signal groups A and B may be designed with the average power maximum value required by the pair $A_i$ and $B_i$. The eight smallest signals, namely signals $204_1$-$204_4$ and $204_{37}$-$204_{40}$ are shown not paired as in FIG. 14. These eight signals may be handled by individual amplifiers each having a uniform relatively low power rating significantly below $P_2/2$, as previously discussed with respect to FIG. 14. Accordingly, the equal power amplifier system for FIG. 15 would have three distinct sizes of power amplifiers. As will be appreciated by those in the art, the principles of the present invention can be readily extended to equal power amplifier systems having equal power amplifying apparatuses of more than two sizes, if desired, while still significantly reducing the number of separate designs which are required.

In the equal power amplifier system described with respect to FIGS. 14 and 15, the signals associated with coefficients $204_1$-$204_4$ and $204_{36}$-$204_{40}$ are not subject to the 90° phase shift experienced by the signals which pass through the equal power amplifier apparatus of the present invention. Accordingly, to maintain the desired phase distribution among the signal sets being supplied to the individual elements 106 of transmit array 20, a 90° phase shift may be added by placing a suitable extra length of transmission line or phase-shifting device 246 (as shown in FIG. 9) into the line delivering the signals to the SSPAs 134.

In order for the beam-forming network 98 of FIG. 8 to produce a set of signals having a desired varying amplitude distribution, of the type shown for example in FIGS. 14 and 15, it is necessary to vary the amplitude distributions of the individual signals within the set as they emanate from the network. There are two preferred ways of accomplishing this. The first way is to provide a set 240 of conventional discrete attenuators 242 as shown in FIGS. 10 and 11 which provide the required degree of attenuation to the signals from the outputs of the radial line summers 176 before the signals are applied to the equal power amplifier system 100. The amount of attenuation required to achieve the desired amplitude distribution can be readily calculated by those skilled in the art. Not every output need be attenuated. Typically however, at a majority will require attenuation. If desired, for example, the two strongest equal-strength signals, e.g., signals $204_{20}$ and $204_{21}$ in FIG. 14 or FIG. 15, need not be attenuated, and the remainings signals 204 can be suitably attenuated relative to the strength of signals $204_{20}$ and $204_{21}$.

The foregoing method of providing a desired amplitude distribution works because each of the cross couplers 180 in the beam-forming network 98 have a uniform coupling fraction such as 0.01 as previously described. In contrast, the second method of providing the varying amplitude distribution relies upon providing different coupling fractions in the cross-couplers 180 associated with each of the radial line summers 176. In other words, the cross-couplers 180 associated with the various cross-over points are constructed so as to pass different percentages of the transmit signals of the lines 168–174 to the waveguides 176, thereby providing the distribution function. In such an arrangement a predetermined amount of the signal, such as 20%, may be dumped into the terminating loads 122, while the remaining percentage of each of the transmit signals T1–T4 is available for transfer to the waveguides 176 through the cross-couplers 180. The sum of the output power of all the cross couplers is thus equal to the remaining percentage (such as 80%). The coupling fraction associated with each waveguide 176 can be determined by dividing the desired amplitude coefficient for the signal to be produced therefrom by the sum of all of the amplitude coefficients in the distribution to be prouced, and then multiplying this fraction by 0.8.

In this second method or arrangement, the percentage of transmit signals passed by the cross-couplers of adjacent waveguides 176 is thus generally different, and varies in a preselected manner from one waveguide 176 to the next, such that the desired distribution is produced in the output signals. The percentage of transmit signals pssed by each of the cross-couplers associated with any given waveguide 176 is made substantially the same when the distribution to be produced in the output signals is substantially the same for each transmit signal T1–T4.

The second method and arrangement thus has the advantage of achieving the desired amplitude distribution without the loss of power in discrete attenuators. However, the first method has the advantage of enabling the beam-forming network 98 with uniform cross-couplers to be utilized to make any desired amplitude distribution by simply changing the discrete or external attenuators 240. Accordingly, the first method has the advantage of allowing corrections and adjustments to the amplitude distribution to be made simply by changing selected ones of the attenuators 204.

FIG. 17 shows a simpler application of the present invention, and demonstrates the usefulness of my equal power amplifier system for efficiently producing, from a single transmit signal the numerous output signals required to drive an array antenna, like array 20 in FIG. 5, having numerous radiating elements to product a desired spot beam. The beam width and shape of the spot beam may vary from very broad to very narrow depending upon the amplitude and phase distribution array size and divider networks associated with the radiating elements and the like.

The single signal to transmitted via the communication electronics of FIG. 17 is received at the satellite (not shown) by a conventional antenna 300 delivered to receiver 302 via signal line 304. Receiver 302 includes a pre-amplification stage to boost the received signal up to power levels suitable for applying the signal to transmit divider network 306. Divider network 306 may employ any conventional or suitable arrangement for dividing the amplified intermediate signal on line 308 into a plurality of transmit signals having the desired amplitude and/or phase distribution. For example, network 306 may employ a conventional corporate feed structure which may have several levels of power dividers 310, followed by attenuators 312, all connected as shown. The attenuators 312 may have different values so as to produce the desired amplitude distribution, which may be a Taylor distribution, for example. In FIG. 17, 16 output signals from the divider network 306 are delivered to an equal power amplifier system 318 along the signal lines 320. The amplifier system 318 has 16 individual amplifiers (not shown) arranged in 8 power amplifying apparatuses which may be constructed in the same manner as apparatus 230 shown in FIG. 16. The amplified outputs emanating from the 8 amplifying apparatuses in the amplifier system 318 are then applied via lines 322 to a transmit array having sixteen radiating elements, which may be conventional feed horns arranged in any desired pattern, elongated waveguide elements similar to staves 106 shown in FIG. 5, or the like. In light of the foregoing, FIG. 17 has demonstrated the suitability of my equal power amplifier system for use in transmit antenna systems employing an array of numerous radiating elements to broadcast a single signal via a spot beam having any desired size or shape.

The foregoing embodiments of the present invention have been described with respect to a satellite communication system for transmitting to multiple ground stations at certain specified frequencies in the Ku band. Those in the art will appreciate that my equal power amplifier system and two level beam-forming network of the present invention may be readily adapted to be used for land, sea or satellite communication systems operated in other frequency bands, such as the C or L bands, for example. The power amplifiers or any other type of suitable power amplifier instead of SSPAs are described above. The size and type of the main reflector, the arrangement and type of arrays of primary radiators, and the specific electronics utilized with the beam-forming network of the present invention may vary substantially without departing from the fair scope of the broader aspects of the present invention. For example, the beam-forming network of the present invention may be used with an array conventional amplifiers and primary radiators with or without parabolic reflectors for forming a fixed location beam of narrow, intermediate or even fairly broad beam width.

As used in the claims, the term "line" means a passive electromagnetic signal-carrying device such as a conductor, waveguide, microwave transmission strip line, or the like. It is to be understood that the above-described embodiments of the present invention are illustrative only, and that variations and modifications thereof may occur to those skilled in the art. Accordingly, the present invention is not to be regarded as limited to the embodiments disclosed herein, but is to be limited only by the appended claims.

I claim:

1. A beam-forming network for producing, from at least one transmit signal, a plurality of output signals having a predetermined relationship with respect to one another for providing a predetermined excitation pattern to an array of radiating elements in an antenna forming a portion of a transmit system having amplifying means for amplifying a plurality of output signals before the output signals are applied to the array, comprising:

a first line for carrying the transmit signal;

a second set of lines spaced from one another and operatively disposed at an angle to and crossing the first line so as to define cross-over points therewith, each of the second lines being coupled to the first line at the cross-over points such that a portion of the electromagnetic energy of the transmit signal carried by the first line is transferable to each of the second lines, each of the second lines having an output adapted to be placed in electromagnetic communication with the array, the first line having first and second portions spaced apart from one another and respectively defining first and second levels displaced from one another, the second set of lines having first and second subsets of second lines respectively arranged adjacent to said first and second levels and respectively associated with the first and second portions of the first line, such that the first subset of second lines is coupled to the first portion of the first line, and the second subset of second lines is coupled to the second portion of the first line, said predetermined excitation pattern defining an amplitude distribution function desired for driving said array of radiating elements to produce a microwave beam having selected characteristics; and means, associated with the cross-over points, for passing different percentages of the transmit signal of the first line to the second lines, thereby providing the desired distribution function.

2. A network as in claim 1, wherein the means for passing different percentages of the transmit signal include a cross-coupler for each cross-over point.

3. A network as in claim 2, wherein the percentage of transmit signals passed by the cross-couplers of adjacent second lines is generally different, and varies in a preselected manner from one second line to the next second line, such that the desired distribution function is produced in the output signals.

4. A network as in claim 2, further comprising:

a plurality of first lines for carrying respective ones of the transmit signals with such first line having the same attributes as said at least one first line, and wherein the percentage of the transmit signal passed by each of the cross-couplers associated with any given second line is substantially the same, whereby the desired distribution function produced in the output signals is substantially the same for each transmit signal.

5. An apparatus for simultaneously forming a plurality of antenna beams signals for transmission by an antenna to a plurality of zones using a plurality of transmit signals respectively corresponding to said zones, wherein each of the transmit signals includes a plurality of subsignals each destined to be received at an associated location in the corresponding zone, comprising:

a plurality of first lines, each having a preselected width, for respectively carrying said plurality of transmit signals and each including an input for receiving a corresponding one of said transmit signals;

a plurality of second lines spaced apart from one another and crossing the first lines so as to define cross-over points therewith, there being a preselected distance between adjacent ones of said cross-over points, each of the second lines being coupled with each of the first lines at the cross-over points such that a portion of energy of each of the transmit signals carried by the first lines is transferred to each of the second lines, each of the second lines having an output for outputting said antenna beam signals, the distance between adjacent cross-over points and the width of each of said first lines being preselected to produce a desired shift in phase of each of said subsignals whereby said subsignals are steered to respectively associated locations in corresponding zones, the first lines each having first and second portions spaced apart from one another which are respectively arranged first and second levels, and the set of second lines having first and second subsets of second lines respectively arranged adjacent to said first and second levels and respectively associated with the first and second portions of the first lines, such that the first subset of second lines is coupled to the first portion of the first lines, and the second subset of second lines is coupled to the second portion of the first lines.

6. An apparatus as in claim 5, wherein said plurality of first lines includes a plurality of transmission lines for conveying electromagnetic energy and said plurality of second lines includes a plurality of electromagnetic energy waveguides.

7. An apparatus as in claim 6, wherein each of said transmission lines is coupled with each of said waveguides by an electromagnetic wave cross-guide coupler.

8. An apparatus as in claim 5, wherein at least two of said first plurality of lines are substantially contiguous to each other.

9. An apparatus as in claim 5, wherein at least two of said first plurality of lines are spaced from each other.

10. A beam-forming network for producing, from a plurality of transmit signals, a plurality of output signals having a predetermined relationship with respect to one another for providing a predetermined excitation pattern to an array of radiating elements in an antenna system, comprising:

a plurality of first lines for carrying respective ones of the transmit signals;

a set of second lines spaced from one another and operatively disposed at an angle to and crossing the first lines so as to define cross-over points therewith, each of the second lines being coupled to each of the first lines at the cross-over points such that a portion of the electromagnetic energy of each of the transmit signals carried by the first lines is transferable to each of the second lines, each of the second lines having an output adapted to be placed in electromagnetic communication with the array, the first lines each having first and second portions spaced apart from one another and respectively defining first and second levels displaced from one another, and the set of second lines having first and second subsets of second lines respectively arranged adjacent to said first and second levels and respectively associated with the first and second portions of the first lines, such that the first subset of second lines is coupled to the first portion of the first lines, and the second subset of second lines is coupled to the second portion of the first lines.

11. A network as in claim 10, wherein selected ones of said first subset of second lines are disposed adjacent to selected ones of said second subset of second lines.

* * * * *